(12) United States Patent
Vora

(10) Patent No.: US 6,897,520 B2
(45) Date of Patent: May 24, 2005

(54) VERTICALLY INTEGRATED FLASH EEPROM FOR GREATER DENSITY AND LOWER COST

(76) Inventor: Madhukar B. Vora, 110 Lansberry Ct., Los Gatos, CA (US) 95032

(*) Notice: Subject to any disclaimer, the term of this patent is extended or adjusted under 35 U.S.C. 154(b) by 163 days.

(21) Appl. No.: 08/654,760

(22) Filed: May 29, 1996

(65) Prior Publication Data
US 2002/0096703 A1 Jul. 25, 2002

(51) Int. Cl.[7] .................................................. H01L 29/788
(52) U.S. Cl. ............................................ 257/316; 257/321
(58) Field of Search ................................ 257/316, 315, 257/320, 321

(56) References Cited

U.S. PATENT DOCUMENTS

| 4,964,080 | A | * | 10/1990 | Tzeng | 257/316 |
| 5,049,956 | A | * | 9/1991 | Yoshida et al. | 357/23.5 |
| 5,071,782 | A | * | 12/1991 | Mori | 257/315 |
| 5,386,132 | A | * | 1/1995 | Wong | 257/320 |
| 5,572,056 | A | * | 11/1996 | Hsue et al. | 257/402 |
| 5,589,413 | A | * | 12/1996 | Sung et al. | 437/43 |
| 5,786,612 | A | * | 7/1998 | Otani et al. | 257/316 |

* cited by examiner

Primary Examiner—Sara Crane
(74) Attorney, Agent, or Firm—Ronald Craig Fish

(57) ABSTRACT

A nonvolative memory in the form of a flash EEPROM with high density and low cost. A vertical MOS transistor is formed in well etched into a semiconductor substrate, the substrate having a buried layer of doped material of a first conductivity type acting as the channel region. Source and drain regions of this transistor comprise second conductivity type layers doped in the substrate above and below the buried layer. A thin gate oxide or oxide-nitride-oxide (ONO) layer is formed in the well and a floating gate of polysilicon is formed over the gate oxide. A layer of oxide or ONO is formed over the floating gate, and a second polysilicon or metal layer is used to fill the well to form the control gate and word line. A bit line is formed of a layer of metal or polysilicon deposited over an insulating layer on top of the word line and makes contact with the drain of the vertical MOS transistor through a contact window formed adjacent the well.

11 Claims, 12 Drawing Sheets

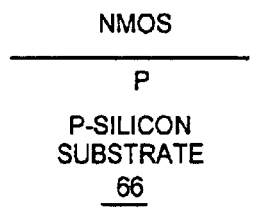
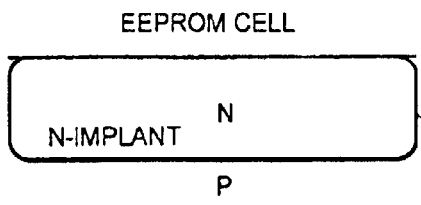
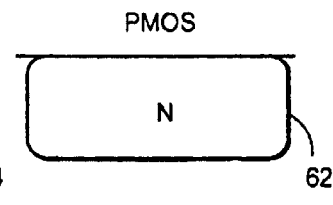
FIG. 7A  FIG. 7B  FIG. 7C
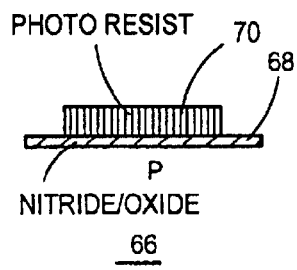
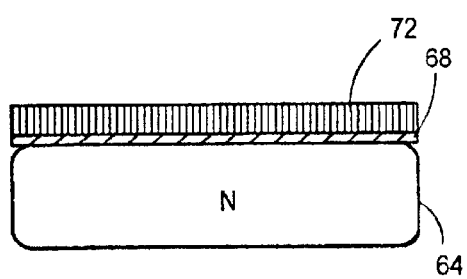
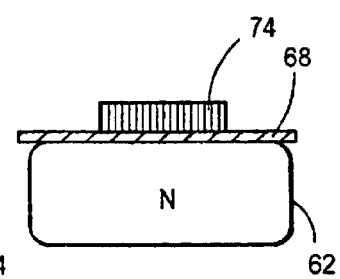
FIG. 8A  FIG. 8B  FIG. 8C
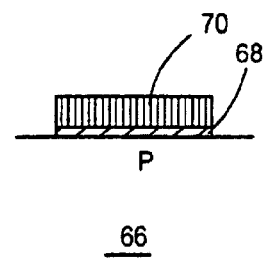
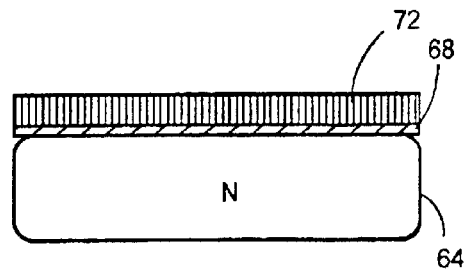
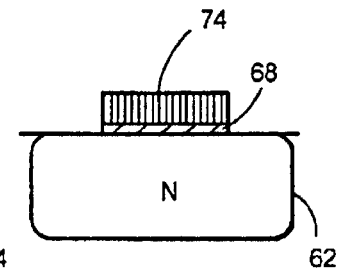
FIG. 9A  FIG. 9B  FIG. 9C

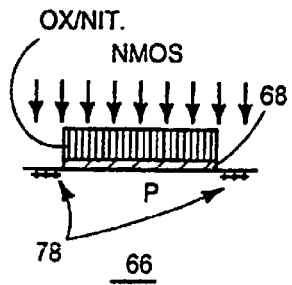
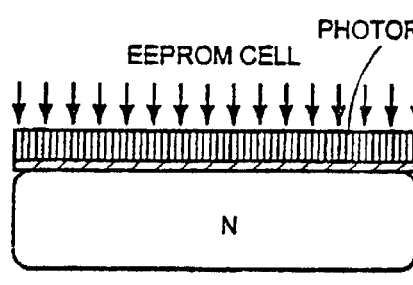
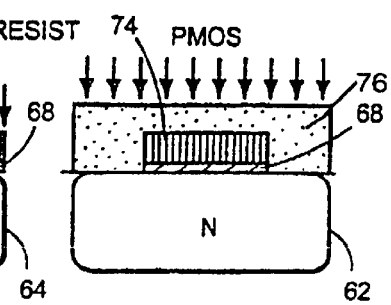
FIG. 10A  FIG. 10B  FIG. 10C
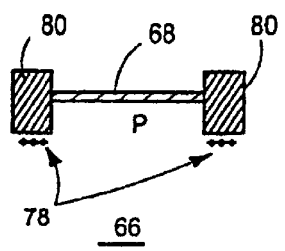
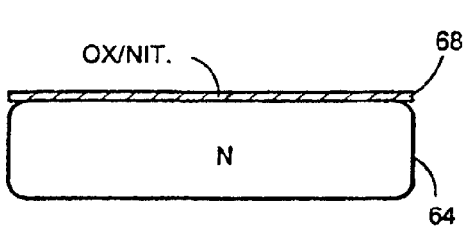
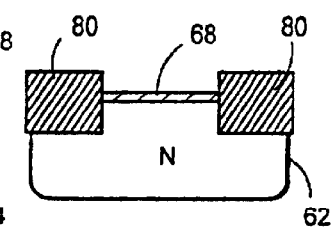
FIG. 11A  FIG. 11B  FIG. 11C
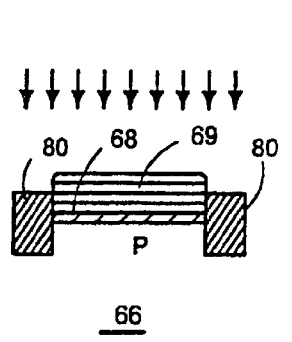
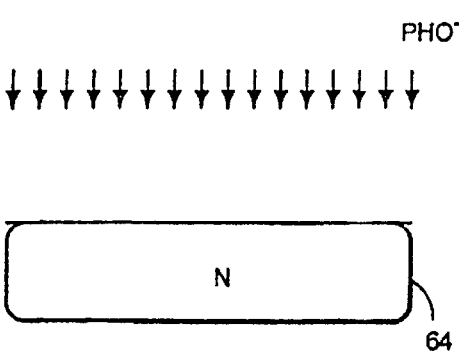
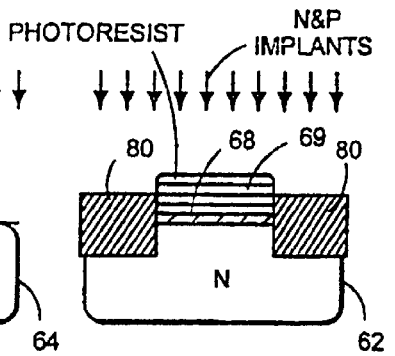
FIG. 12A  FIG. 12B  FIG. 12C

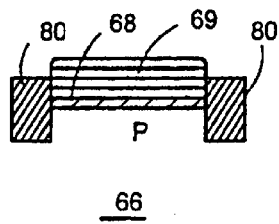 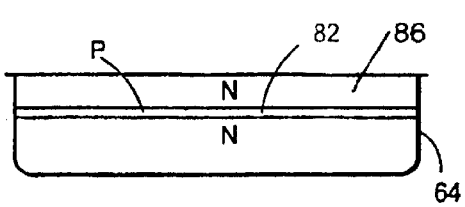 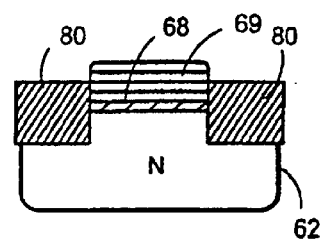
FIG. 13A     FIG. 13B     FIG. 13C
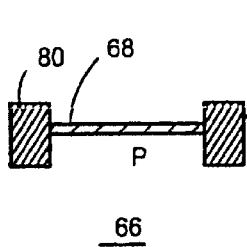 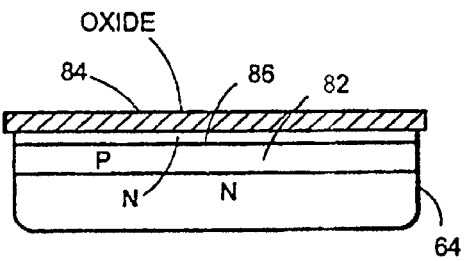 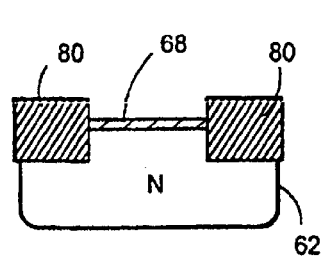
FIG. 14A     FIG. 14B     FIG. 14C
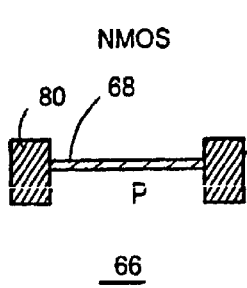 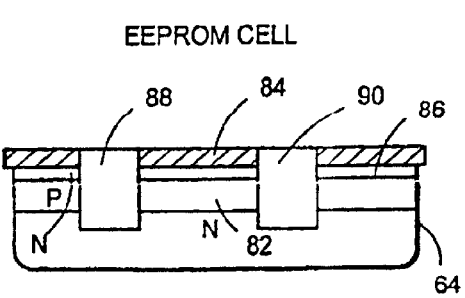 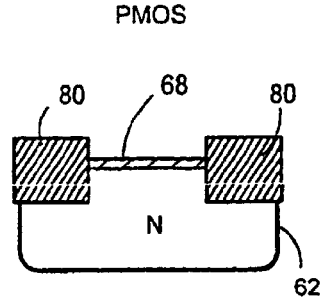
FIG. 15A     FIG. 15B     FIG. 15C

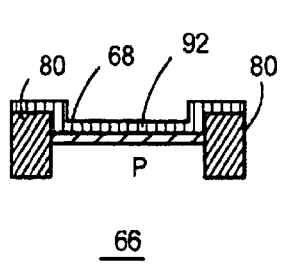 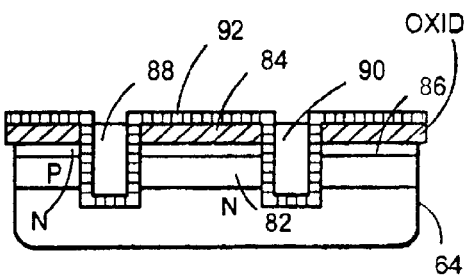 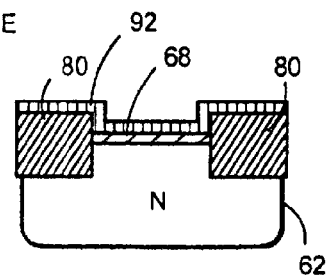
FIG. 16A  FIG. 16B  FIG. 16C
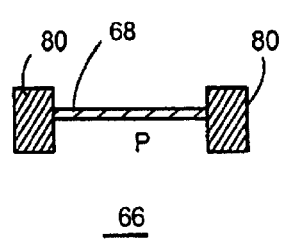 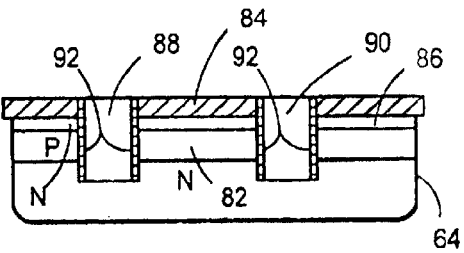 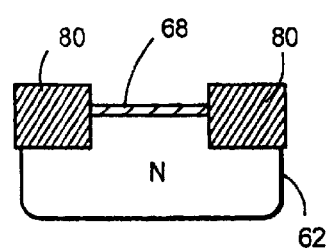
FIG. 17A  FIG. 17B  FIG. 17C
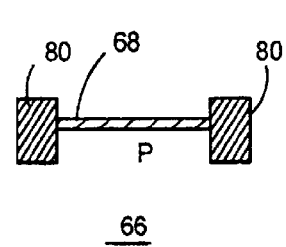 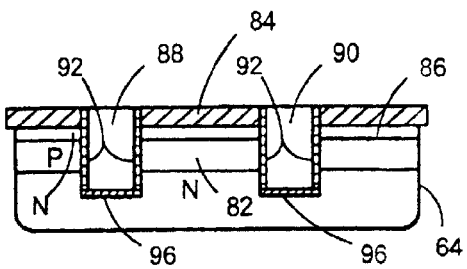 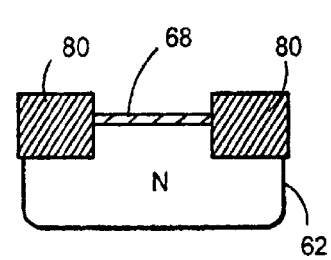
FIG. 18A  FIG. 18B  FIG. 18C

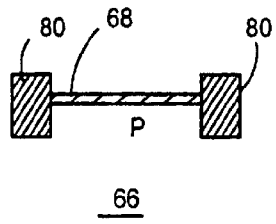 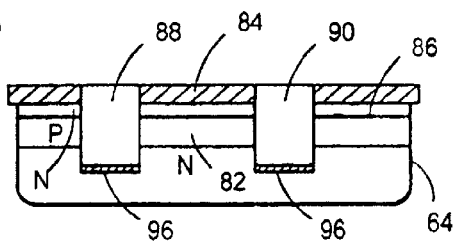 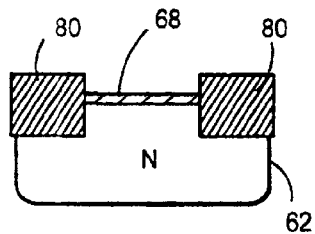
FIG. 19A            FIG. 19B            FIG. 19C
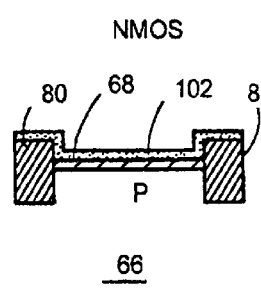 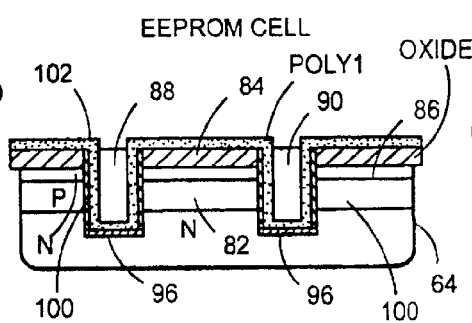 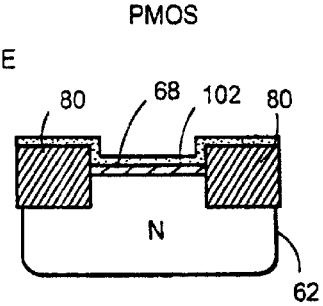
FIG. 20A            FIG. 20B            FIG. 20C
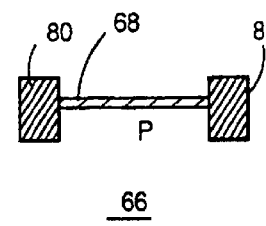 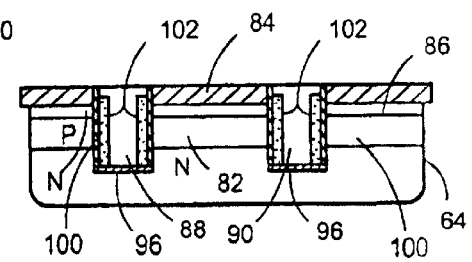 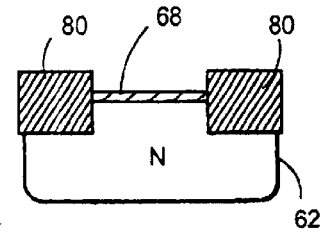
FIG. 21A            FIG. 21B            FIG. 21C

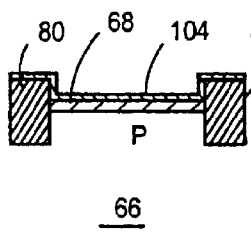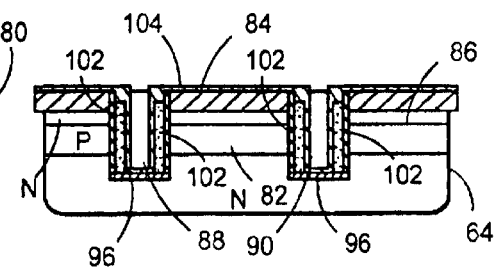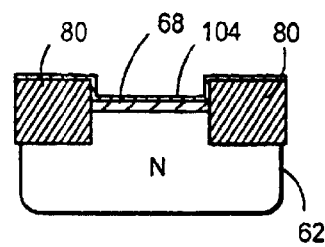
FIG. 22A      FIG. 22B      FIG. 22C
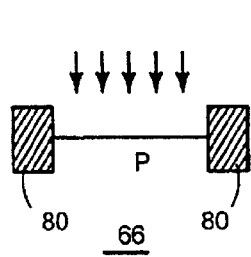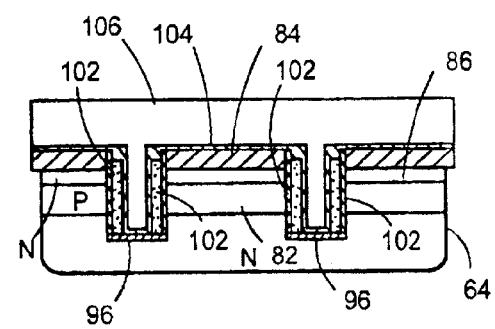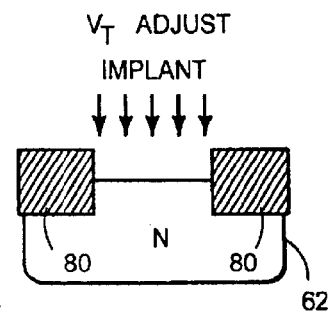
FIG. 23A      FIG. 23B      FIG. 23C
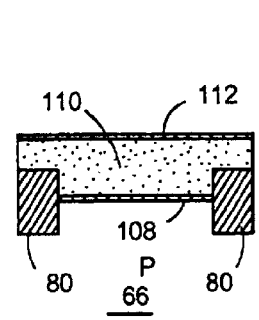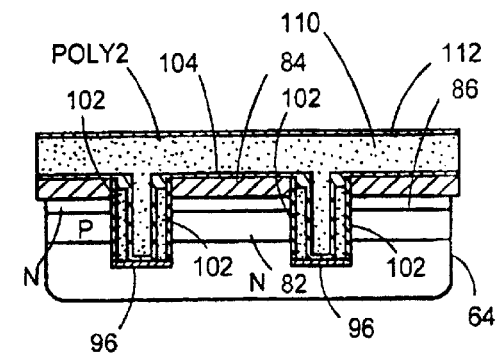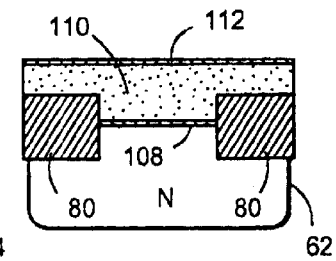
FIG. 24A      FIG. 24B      FIG. 24C

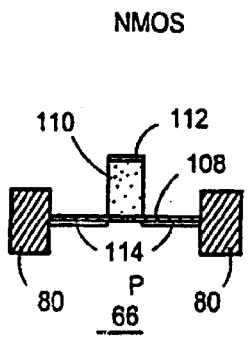
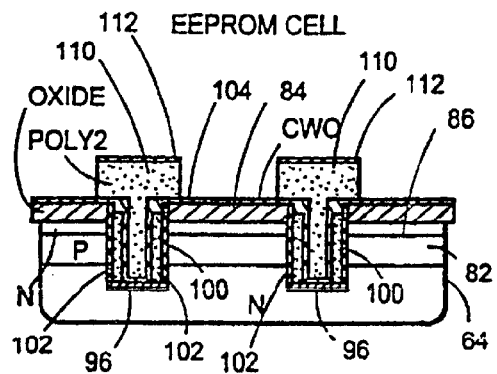
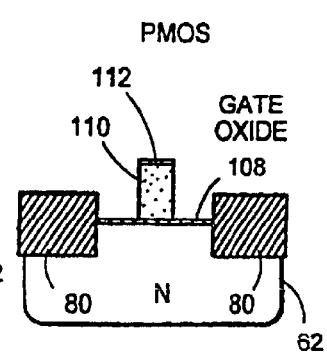
FIG. 25A  FIG. 25B  FIG. 25C
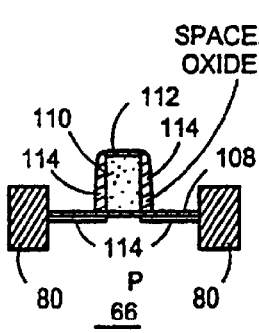
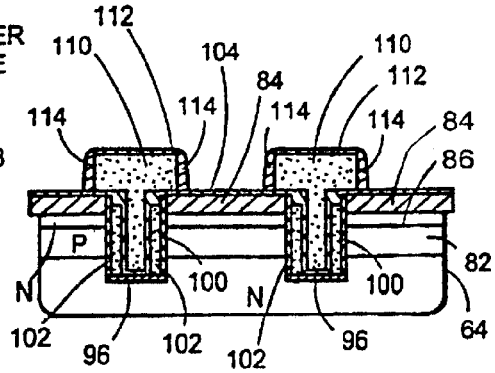
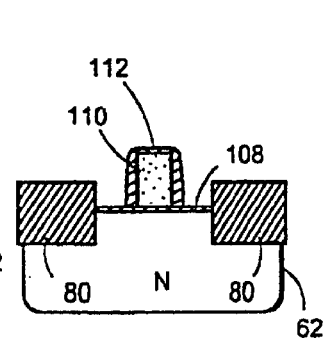
FIG. 26A  FIG. 26B  FIG. 26C
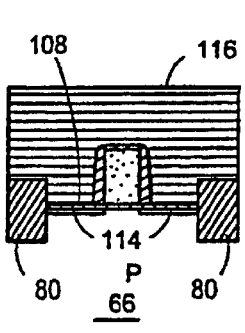
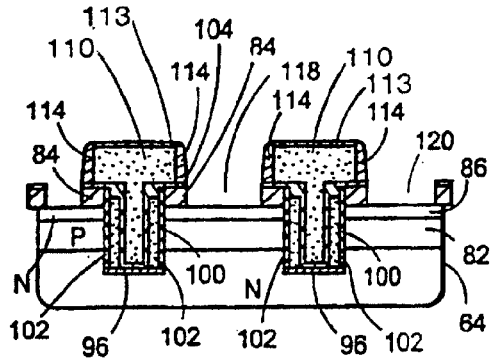
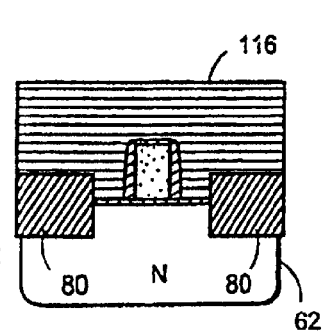
FIG. 27A  FIG. 27B  FIG. 27C

PMOS

EEPROM CELL

NMOS

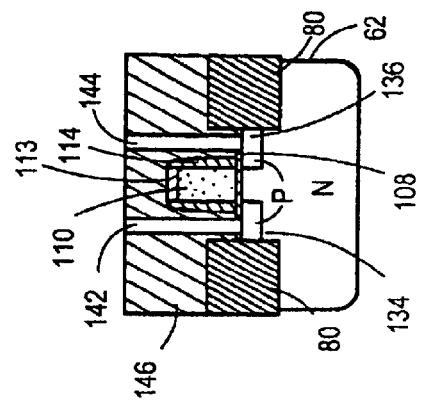
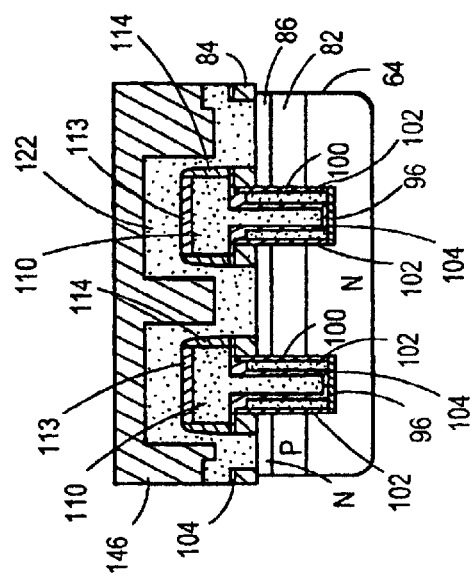
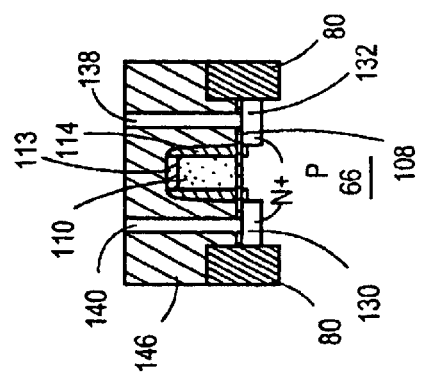
FIG. 30A
FIG. 30B
FIG. 30C
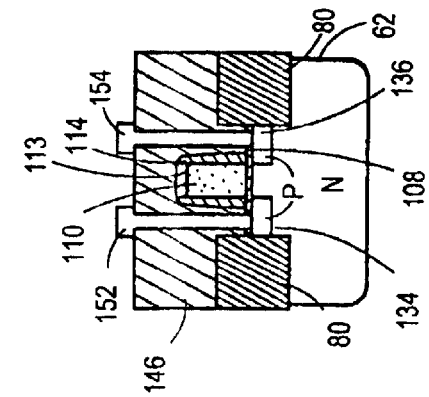
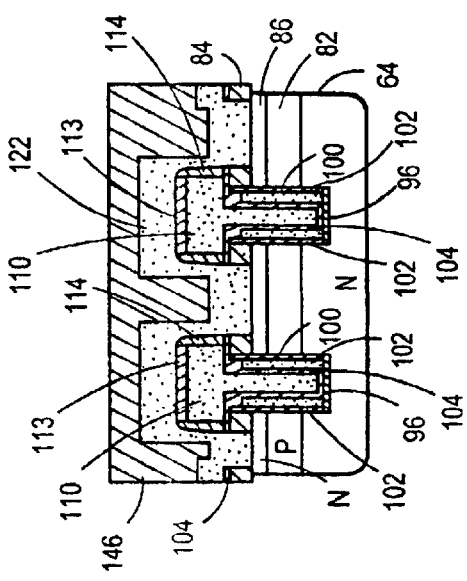
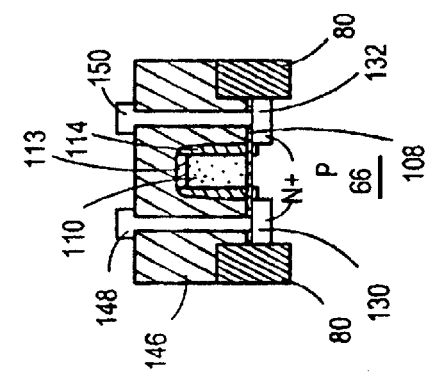
FIG. 31A
FIG. 31B
FIG. 31C

TOP VIEW
FINISHED CELLS (FOUR)

SECTION A-A'

SECTION B-B'

VERTICALLY INTEGRATED FLASH EEPROM FOR GREATER DENSITY AND LOWER COST

BACKGROUND OF THE INVENTION

The invention pertains generally to the field of semiconductor, nonvolatile memories, and, more particularly, to the field of vertically-integrated, flash EEPROMS which can be manufactured with sufficient density to be cheap enough to compete with rotating magnetic media for bulk memory applications. The vertically-integrated, flash EEPROM according to the teachings of the invention is especially useful in personal computers of the laptop, notebook and palmtop variety although it is broadly applicable to any application where large, nonvolatile memory is needed which is physically rugged and competitive with disk drives in price.

Flash EEPROMS are known in the prior art, but the problem to date has been that they cannot be made cheaply enough for them to have mass market appeal. The size of prior art EEPROM cells has been so large, that the number of cells per semiconductor die that can be made with adequate yield was too low to have a cost which was competitive with rotating memories such as disk drives.

Prior art flash EEPROM cells of the most aggressive design made by Intel Corporation of Santa Clara, Calif. are 78 square microns using 0.8 micron design rules. With a semiconductor die size of 1 square centimeter, this cell size allows flash EEPROMS of 48 megabits to be built for a cost of about $30 per megabit.

In contrast, small disk drives can be manufactured for about $5 per megabyte. Therefore, a need has arisen for a smaller flash EEPROM cell such that more dense memories can be built for lower cost.

SUMMARY OF THE INVENTION

According to the teachings of the invention, a vertically constructed flash EEPROM cell is taught herein which allows a cell size of 24 square microns to be achieved. With present 6 inch wafers and 0.8 micron design rules and 40,000–60,000 square mil dies, the cost per megabit of memory cells is a substantial improvement over the $30 per megabit cost of prior art EEPROM cells. With the migration toward 8 inch wafers and 0.6 micron design rules larger die sizes of 100,000–200,000 square mils will be possible, and the cost per megabit of memory cells according to the teachings of the invention should improve greatly.

BRIEF DESCRIPTION OF THE DRAWINGS

FIGS. 7A, B and C through FIGS. 31A, B and C are cross-sectional views showing various stages of simultaneous construction of an NMOS transistor, a PMOS transistor and a vertically oriented EEPROM cell according to a process compatible with fabrication of CMOS drivers for the EEPROM array according to the teachings of the invention.

DETAILED DESCRIPTION OF THE INVENTION PREFERRED EMBODIMENT

Figure 1:
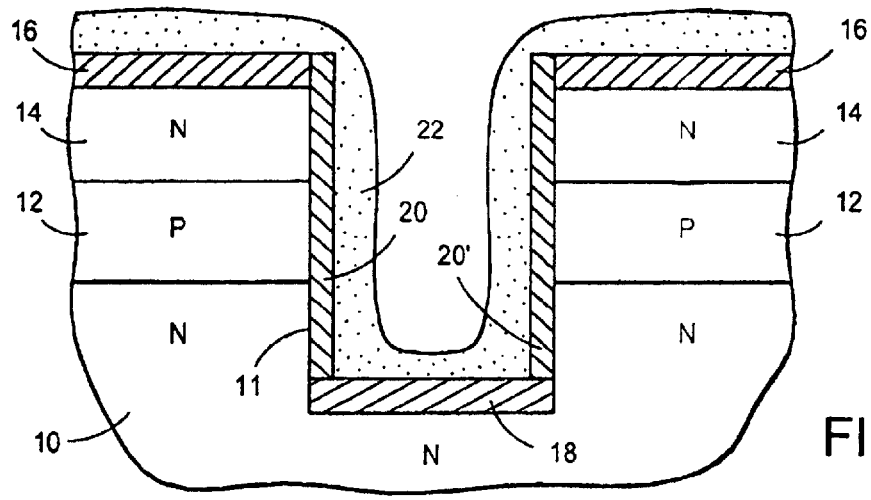
FIG. 1 is a cross-sectional view of a semiconductor substrate at an intermediate stage in construction of a vertical EEPROM call after the recessed gate window has been formed and first polysilicon has been deposited.

Referring to FIG. 1, there is shown a cross-sectional view of an intermediate stage in the construction of the EEPROM memory cell according to the teachings of the invention. Although a detailed process schedule and series of drawings illustrating the exact method of making one embodiment of the invention will be presented below, FIGS. 1–3 will be used to summarize the construction of an EEPROM memory cell according to the teachings of the invention.

To reach the stage of construction shown in FIG. 1, a one micron deep well is etched into an N type silicon substrate 10 having a resistivity of 10 Ohm centimeter. A P doped region 12 is formed about midway down the well. An N doped region 14 lies above the P type region 12. An oxide layer 16 having a thickness of about 2000 angstroms is grown on top of the substrate. An oxide layer 18 is grown at the bottom of the well and has a thickness of about 1000 angstroms. A thin annular oxide layer, sections of which are shown at 20 and 20', is grown on the sidewalls of the well to insulate a first layer of doped polysilicon 22 which is deposited on the surface of the substrate and into the well.

Figure 2:
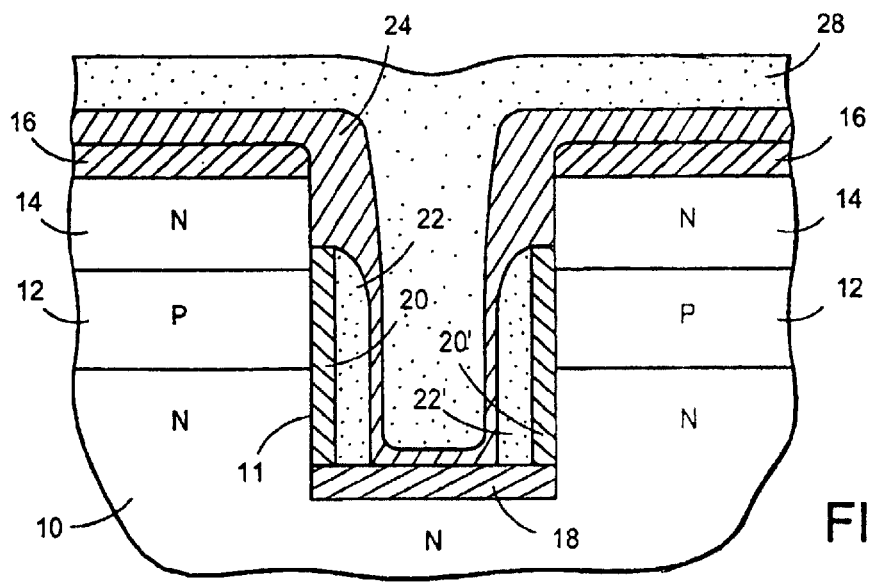
FIG. 2 is a cross-sectional view of a semiconductor substrate at an intermediate stage in construction of a vertical EEPROM cell after the floating gate has been formed.

FIG. 2 shows a subsequent stage of construction after an anisotropic etchback to remove the upper portions of the first polysilicon layer and the first polysilicon lying in the bottom of the well above oxide layer 18. This leaves a floating gate comprised of an annular first polysilicon layer, two sections of which are shown at 22 and 22'. This floating gate is isolated from the substrate by the thin oxide layer 20. To complete the electrical isolation of the floating gate layer 22, a layer of ONO insulator 24 is deposited over the surface of the substrate and in the well.

Figure 3:
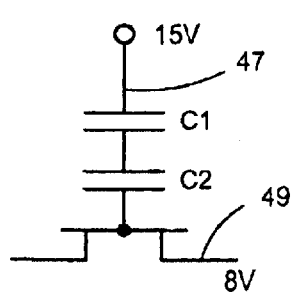
FIG. 3 is an equivalent circuit showing the two capacitors of the floating gate structure.
Figure 4:
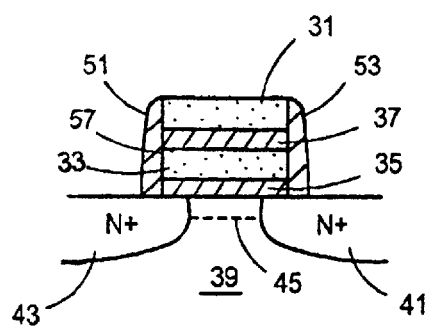
FIG. 4 is a vertical cross-sectional diagram of a typical prior art EEPROM cell through the floating gate structure.

The thickness and integrity of the ONO layer is important to the coupling ratio in an EEPROM which is important in the write process. Referring to FIG. 3, there is shown an equivalent circuit of the floating gate and control gate structure shown in FIG. 4. Although FIG. 4 represents the structure of a typical prior art floating gate EEPROM structure, it is used here to illustrate the functioning of an EEPROM cell and the significance to the write process of the coupling ratio between the capacitance of capacitor C2 and the capacitor C1 in FIG. 3. Capacitor C2 represents the capacitor formed between the control gate 31 and the floating gate 33 in FIG. 4. Capacitor C1 represents the capacitor formed between the floating gate 33 and the substrate 39. Layers 35 and 37 are thin oxide or ONO insulating layers (oxide-nitride-oxide) that separate the polysilicon one floating gate layer 33 from the substrate 39, and the polysilicon one floating gate layer from the polysilicon two control gate layer 31, respectively. These two insulation layers separating the conductive polysilicon layers define the capacitors C1 and C2 in FIG. 3. Two oxide spacer layers 51 and 53 insulate the self aligned edges of the slacked control gate and floating gate structure.

One problem with the prior art stacked structure of FIG. 4 was leakage at the corner 57 where ONO is used for insulation layer 37. At this corner, ONO joins the oxide of the spacer layer 51 (the same holds true for the other side) and the electrical seal against charge leaking out of the floating gate is not perfect because of the concentration of electric field lines at this corner.

The significance of the coupling ratio pertains to the effectiveness of causing injection of electrons or wells into the floating gate 33 so as to alter the trapped charge therein. It is the presence of trapped charge in the floating gate 33 which alters the threshold of the MOS transistor formed by the floating gate 33, and the source region 41 and the drain region 43 in FIG. 4. For one state of trapped charge, an inversion of conductivity type in the substrate 39 between the source and drain regions will occur thereby forming a conductive channel through which conduction occurs between the source and drain regions. This channel is symbolized by dashed line 45, and this state of charge can be defined as either a binary 1 or 0. In the other state of charge of the floating gate, no inversion channel occurs, and no conduction between the source and drain occurs. Charge is trapped in the floating gate 33 by tunneling or injection during the write or program process. It is desirable to have the capacitance of capacitor C1 much less than the capacitance of capacitor C2 to insure that sufficient injection or tunnelling of electrons from the source or channel region into the floating gate occurs during the write process. This injection or tunnelling phenomenon occurs when approximately 15 volts is applied to the control gate terminal 47 in FIG. 3 and approximately 8 volts is applied to the source 49 during the write process if C2 is greater than C1. C2 and C1 effectively form a voltage divider between the potential applied to the control gate terminal 47 and the potential of the channel region. It is desirable to have relatively more of the voltage drop from the channel to the control gate terminal 47 occur across capacitor C1 to maximize the tunnelling phenomenon. In other words, when the programming voltage is applied, tunnelling current begins to charge up both capacitors. The smaller capacitor C1 charges up to a higher voltage thereby altering the threshold of the MOS transistor sufficiently to create the inversion channel.

Therefore, since the first oxide layer 35 in FIG. 4 or 20 in FIG. 2 should be very thin to increase the capacitance of C1 to enhance tunnelling current for writing and erasing, it is necessary for the second oxide layer 37 to be as thin or thinner than the first oxide layer so that C2 is greater than C1. Alternatively, the area of C2 can be made greater than the area of C1. Because of the need for a thin second insulator layer, the material used for the second insulating layer 37 is very important in that it must have high electrical integrity. Generally, ONO is preferred for this purpose because of its high integrity as an electrical insulator and oxide interfaces on both surfaces. Because ONO creates more surface states which would adversely affect the operation of the underlying MOS transistor, ONO cannot be used for the first insulation layer 20 in FIG. 2.

ONO layer 24 in FIG. 2 is made by oxidizing the underlying layers to a thickness of about 30 angstroms and then depositing approximately 150 angstroms of nitride. Thereafter, steam oxidation of the nitride is performed to form an additional 30 angstroms of oxide. Because of the different dielectric constant of nitride, the overall dielectric constant of the ONO layer 24 is approximately the same as that of 100 angstroms of oxide. ONO works especially well to preserve the trapped charge in the floating gate to alleviate a problem of escaping charge at the corners of the floating gate which existed in the prior art.

After the ONO layer 24 is deposited, a second layer of doped polysilicon 28 is deposited to fill the well and is etched to form the word line.

Figure 5:
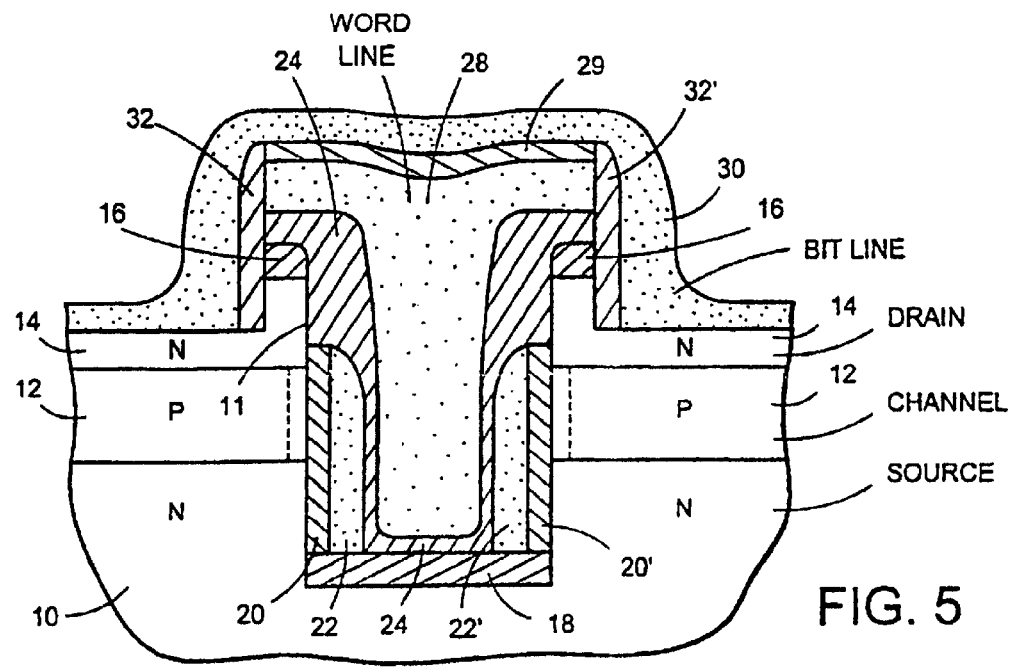
FIG. 5 is a vertical cross-sectional diagram of the finished vertical EEPROM structure.

FIG. 5 shows in vertical section the completed device. To reach the state of construction shown in FIG. 5, a layer of oxide 29 is grown on the second polysilicon layer 28. Then a mask is formed over the second polysilicon layer 28 to protect the portion thereof overlying the well which it fills. Thereafter, an anisotropic etch is performed to etch down through the polysilicon layer 28, the ONO layer 24, the oxide layer 16 and part of the way through the N-type silicon layer 14 to open a contact well for the bit line 30.

After this contact well is opened, an annular oxide spacer, sections of which are shown at 32 and 32', is formed to seal and insulate the sides of the structure from the bit line to be formed next. The oxide spacer is formed by growing or depositing a layer of oxide over the entire structure and anisotropically etching it back to leave the vertical sections of oxide.

The bit line is shared by all devices in a row and is formed by depositing a third layer of polysilicon 30 over the entire structure and etching it to selectively make contact with the N-type silicon layer 14 which forms the drain of the vertical annulus MOS transistor formed inside the well. The source of the vertical MOS transistor is the N-type substrate 10. The channel region for this transistor is formed by the P-type silicon layer 12. The gate oxide between the channel region and the floating gate 22 is oxide layer 20. The control gate is comprised of second polysilicon layer 28, and extends down into the page and up out of the page to form the word line.

Figure 6:
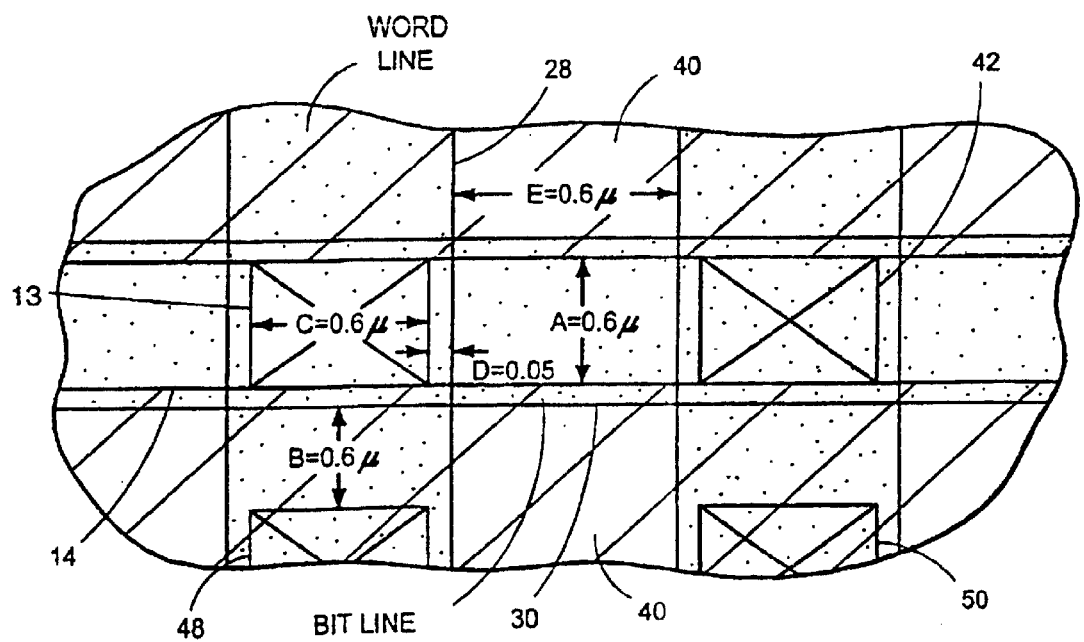
FIG. 6 is a plan view of a cell array using the vertically oriented EEPROM cells according to the invention.
Figure 29C:
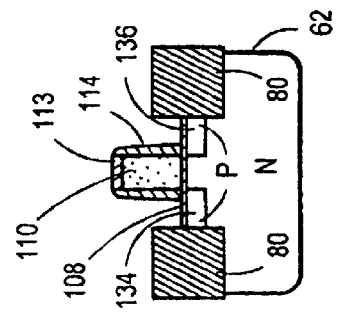

FIG. 6 shows a plan view of the EEPROM cell. Field oxide 40 defines the outer boundaries of the N-type silicon layer 14 through which the wells 13 and 42 are formed. The polysilicon or metal bit line 30 (polysilicon is shown and preferred for better step coverage) runs from left to right over and in contact with the N-type silicon layer 14 and slightly overlaps the field oxide layer. The bit line also overlaps the word line polysilicon 28 which fills the well 11. The details of the structure down inside the well are not shown in FIG. 6 for simplicity.

The length of the cell shown in FIG. 6 is equal to the dimension A defining the length of the well plus the dimension B which defines the pitch or minimum spacing between the wells. In FIG. 6, the next row of wells is represented by wells 48 and 50. For 06 micron design rules, A=0.6 micron and B=0.6 microns for a total length of 1.2 microns.

The width of the cell is equal to the dimension C which defines the width of the well, plus the dimension D which defines the overlap of the second polysilicon layer 28 past the edge of the well, plus the dimension E equal to the pitch between the second polysilicon word lines 28 between columns. For 0.6 micron design rules, C=0.6 microns, D=0.05 microns and E=0.6 microns for a total cell width of 1.3 microns. Thus, the total cell area for 0.6 micron design rules is 1.56 square microns.

With a cell size of 1.56 square microns, a 64 megabit EEPROM memory can be built on a die of 1–2 square centimeter size. With 6 inch wafers, the wafer area is 28 square inches. At 6.54 square centimeters per square inch, a 6 inch wafer contains 182 square centimeters. With a die size of 2 square centimeters, a 6 inch wafer yields about 90 die. Because well known redundancy techniques can be used to repair defective cells, yields in EEPROM production are typically high, averaging around 80 percent. Thus, a typical production run will yield about 72 good die. Typical production costs for a 6 inch wafer are about $500, so the cost per 64 megabit (8 megabytes) die is about $6.94 or about $0.86 per megabyte. A 40 megabyte EEPROM memory using the teachings of the invention would cost about $34.72. This cost should come down with the introduction of 8 inch wafers at 0.6 micron line widths. Typical costs are expected to be about $3.87 per 8 megabyte EEPROM memory or 48 cents per megabyte for a total cost for a 40 megabyte memory of $19.37. Of course any change in any of the numbers of assumptions or numbers used in the above calculations will yield different costs per megabyte. Todays cost for typical prior art EEPROM memory sold by Intel Corporation is about $30 per megabyte manufactured using 0.8 micron design rules. Note that in the above cost calculations, 0.6 micron linewidths were assumed. Costs for prior art EEPROM cells using 0.6 micron design rules should fall to about $15 per megabyte.

A detailed description of how to make the EEPROM memory cell according to the teachings of the invention follows in connection with the discussion of FIGS. 7A, B and C through FIGS. 30A, B and C. The preferred process is compatible with CMOS processing so that the EEPROM memory can be built on the same die with CMOS drivers. Accordingly, in each of FIGS. 7A, B and C through FIGS. 30A, B and C, the figures in the left column labelled Figure__A is the corresponding NMOS structure and the figures in the right column labelled Figure__C is the corresponding PMOS structure. A summary of the process is given in Appendix A. In Appendix A, the individual steps in the process are numbered, and the steps in which the masks are used are given in the column second from the right. The figure numbers in the rightmost column of Appendix A show the state of construction after the steps preceding the line on which the particular figure number is listed have been completed.

Referring to FIGS. 7A, B and C, there is shown the state of construction after the first nine steps in Appendix A. To reach the state of construction shown in FIGS. 7A, 8 and C, a P-type silicon substrate having a conventional resistivity is used as the starting material.

Then a layer of oxide (silicon dioxide) is thermally grown to a thickness of approximately 300 angstroms.

Next a layer of nitride (silicon nitride) is deposited to a thickness of about 1000 angstroms using chemical vapor deposition (CVD), low pressure CVD (LPCVD) or plasma enhanced chemical vapor deposition (PECVD).

A layer of photoresist is then deposited and developed using the first level twin-well mask to define the twin wells needed to form CMOS devices.

After forming the twin well mask layer of photoresist, the nitride layer is etched away over an area to be implanted with phosphorous to form the N-type wells 62 and 64 in which to form the PMOS device and the EEPROM device. Any process for etching the nitride will suffice.

To form the N-well, phosphorous is implanted to a depth of about 3000 angstroms using conventional dosage levels. Then the phoshorous is driven in and the N-well area has another layer of oxide grown thereover using a 1000 degree centigrade oven for one hour. This leaves the structure as shown in [FIG. 1] FIGS. 7B and 7C with an N-well 62 for the PMOS device, and N-well 64 in which the EEPROM device is to be constructed.

Next, the photoresist and nitride are stripped, and boron is implanted to form the P-well 66. Both wells are then driven deeper using a 1100 degree centigrade oven for 5 hours to form wells that are 5–6 microns deep.

The oxide is then etched away over the N-wells 62 and 64 to clear the substrate surface for further processing.

Finally, a 1000 angstrom nitride layer is formed as shown in FIGS. 8A, B and C with the oxide and nitride layers shown as a single layer at 68.

Next, a layer of photoresist is deposited and an active mask (mask 2) is used to cross-link (develop) sections thereof to leave the structure as shown at FIGS. 8A, B and C with a photoresist section 70 over the P-well, photoresist section 72 over the EEPROM cell area and photoresist section 74 over the N-well.

The oxide/nitride layer 68 is then etched using the photoresist as a mask to leave the structure as shown in FIGS. 9A, B and C.

A field implant must be performed to implant boron at the edges of the active area of the NMOS device to prevent the formation of parasitic channels, i.e., unintended MOS transistors. To perform this implant, it is necessary to mask off the N well of the PMOS device. This is done by depositing a layer of photoresist 76 and developing it with the field implant mask, i.e., mask 3 to leave the second photoresist layer 76 covering the N well. A boron implant is then performed to deposit the P-type field implant impurities shown at 78 in FIG. 10A.

After the field implant, the field regions outside the active areas are oxidized to a thickness of 6000 angstroms to leave the structure as shown in FIGS. 11A, B and C. The field oxide is shown at 80. The areas under the field oxide remain doped so they do not invert and form parasitic MOS devices.

Next the fourth mask is used to remove the nitride portion of layer 68 of oxide/nitride by protecting all structures with photoresist except the oxide/nitride layers 68 over the EEPROM cells. After developing the photoresist with the fourth mask, a conventional oxide/nitride etch is performed to leave the structure as shown in FIGS. 12A, B and C with photoresist layer 69 protecting the NMOS and PMOS active areas. This leaves a thin layer of pad oxide (not shown) over the EEPROM active areas.

Leaving the photoresist 69 over the NMOS and PMOS wells to protect them, a boron ion implantion is performed through the pad oxide (not shown) to form the buried P region 82 below the surface of the N well in which the EEPROM cell is to be formed. Typically, the dosage for this implant will be 1E+12 (on the order of 10 to the 12th power) with an energy level of 100 KEV. This implant forms the channel region in the vertical annular EEPROM cell. As the term annular is used herein, the horizontal cross section through the EEPROM transistor below the surface of the substrate can be either circular, square, rectangular or some other shape.

Next, leaving the photoresist in place over the NMOS and PMOS devices, an arsenic implant is performed at a lower energy level to redope the area 86 below the surface of the substrate but above the P region 82 back to N type to act as the drain region of the vertical MOS transistor EEPROM device as shown in FIGS. 13A, B and C. Typically, 30 KEV is used with a dose of 1E+14.

Still leaving the photoresist in place over the NMOS and PMOS devices, a layer of oxide 84 is grown over the EEPROM cell to leave the structure as shown in FIGS. 14A, B and C.

The EEPROM cell area will be used to form two vertical EEPROM devices. To start this process, a layer of photoresist (not shown) is deposited and a fifth mask is used to develop the photoresist so as to open two cell etch windows over the EEPROM cell area. An anisotropic plasma etch process is then used to etch through the oxide layer 84 and etch down into the silicon to form two wells 88 and 90 also called recessed gate windows. These recessed gate windows must have sufficient depth to penetrate the N layer 86 and the P layer 82 and extend into the N well 64 of the EEPROM cell. This leaves the structure as shown in FIGS. 15A, B and C.

A pad oxide layer (not shown) 300 angstroms thick is grown next. This layer covers the first nitride layer 68 over the NMOS and PMOS devices, the oxide layer 84 over the EEPROM cells and covers the walls and bottoms of the recessed gate windows 88 and 90. This pad oxide layer protects the underlying structures from a second layer of nitride to be deposited next.

A second layer of nitride 92 approximately 500 angstroms thick is then deposited over the entire structure. This layer covers the walls and the bottom of the two recessed gate windows 86 and 90 and covers the top surface of the substrate.

An anisotropic etchback is then performed to remove all portions of nitride layer 92 on horizontal surfaces and leave only those portions on vertical surfaces, i.e., all nitride of layer 92 is removed except those portions on the vertical walls of the recessed gate windows to leave the structure as shown in FIGS. 17A, B and C.

Next, a layer of oxide insulator 96 is grown on the bottoms of the recessed gate windows. The nitride of layer 92 is then removed from the walls of the recessed gate windows 88 and 90 using a wet etch to leave the structure as shown in FIGS. 19A, B and C.

The pad oxide (not shown) underneath the second nitride layer 92 is then removed in a wet etch. Because the pad oxide layer was not separately shown, the structure after its removal looks as shown in FIGS. 19A, B and C.

A thin gale oxide layer 100 is then grown on the walls of the recessed gate windows 88 and 90 to insulate the polysilicon floating gate to be formed later from the silicon layers 86 (drain), 82 (channel) and 64 (source). Typically, this gate oxide is grown to a thickness of 90 to 100 angstroms in a process conventional to MOS devices.

Next, a layer of P type doped polysilicon 102 is deposited over the complete structure from which the floating gate 22 in FIG. 5 will be formed to leave the structure as shown in FIGS. 20A, B and C. Typically, about 1000 angstroms of polysilicon is deposited and is doped P type with chemical dope of phosphorous either during or after deposition to a resistivity of 50 ohms per square.

To form the floating gate, the doped polysilicon is etched back off all horizontal surfaces and part way down into the recessed gate windows 88 and 90 to leave the segments of polysilicon shown at 102 in FIG. 218. These segments of doped polysilicon 102 correspond to the floating gate 22 in the finished structure shown in FIG. 5 and are self aligned with the walls of the recessed gate windows 88 and 90 because no horizontal component of doped polysilicon is left on the surface of the substrate or on the bottom of the recessed gate windows which means no portion of the doped polysilicon will ever extend beyond the perimeter of the recessed gate window (see FIG. 21B for the configuration of the doped polysilicon floating gate 102 after the etchback). No mask is used for the etchback of the doped polysilicon layer 102 as can be seen from study of Table 1 steps 33 and 34 where no mask is recited as being used during the etchback. All steps that use masks are recited in Table 1 as using a mask and the mask number is given in the third column from the left.

Electrical isolation of the floating gate is accomplished by formation of another oxide-nitride-oxide layer 104 over the entire wafer to leave the structure as shown in FIGS. 22A, B, C. Typically, the ONO layer 104 is formed to a thickness of 150 angstroms by a conventional process.

At this point in the process, construction of the NMOS and PMOS devices is started in parallel with the completion of the EEPROM devices. The first step in this process is to deposit a layer of photoresist and develop it with mask 6 to form an ONO protect mask 106 over the EEPROM cell area as shown in FIG. 23B. Then an ONO etch and a nitride etch are performed to remove the ONO layer 104 and the nitride layer 68 over the NMOS and PMOS transistor active areas to leave the structure as shown in FIGS. 23A, B and C. The pad oxide (not shown) under the nitride layer 68 is left in place to protect the silicon from the threshold adjust implant to be performed next.

A threshold voltage adjustment is next performed by a conventional boron implant to implant charges into the surface region of the N well 62 and the P well 66 to adjust the voltages at which the PMOS and NMOS devices turn on. The design is such that one CMOS device threshold voltage is too low and the other CMOS device threshold voltage is too high before the threshold adjust implant. Then the threshold voltages are adjusted simultaneously in the proper directions by the threshold adjust implant.

After the implant, the pad oxide (not separately shown) that was under the oxide layer 68 is etched away to prepare the NMOS and PMOS devices for growth of a thin gate oxide. During this process the photoresist mask 106 is left in place to protect the EEPROM cell area.

A thin gate oxide layer 108 is then grown over the N well 62 and the P well 66 to electrically insulate a gate electrode to be formed later from the underlying silicon. During this process the photoresist mask 106 is left in place to protect the EEPROM cell area.

Next, the photoresist mask 106 is removed, and a second doped polysilicon layer 110 is deposited to a thickness of about 3000 angstroms. The control gates for the PMOS, NMOS and EEPROM devices will be formed from this polysilicon layer 110. This second polysilicon layer also fills the recessed gate windows 88 and 90 and covers the ONO layer 104.

A thin layer of silicon dioxide 112 is then grown over the entire second polysilicon layer 110 to a depth of about 2000 angstroms.

A seventh mask is then used to develop a layer of photoresist deposited over the second polysilicon layer 110 and oxide 112 for purposes of etching the second polysilicon layer to form the control gates of the PMOS and NMOS devices and of the EEPROM cells and the word lines corresponding to word line 28 in FIGS. 5 and 6. After the etch of the second polysilicon by a conventional process, the structure looks as shown in FIGS. 25A, B and C except that an LDD phosphorous implant to form the source and drain regions of the NMOS device has not yet been performed.

To form the source and drain regions of the NMOS devices, an 8th mask is used to develop a layer of photoresist to form an LDD implant mask over the PMOS and EEPROM devices. Then phosphorous is implanted in a conventional process using the etched second polysilicon layer 110 over the NMOS device as a mask to form self aligned LDD regions (lightly doped drain regions) shown at 114 in FIG. 25A. Later, more heavily doped, deep source and drain regions will be formed, but the LDD implants prevent short channel problems.

To protect the sidewalls of the control gates of the NMOS, PMOS and EEPROM devices, a spacer oxide deposition is performed to a depth of 3000 angstroms and then the spacer oxide is etched back to form the spacer oxide regions 114 on the sidewalls of the polysilicon control gates formed from second polysilicon layer 110. The spacer etch is an anisotropic etch to remove the spacer oxide from only the horizontal surfaces.

Figure 28C:
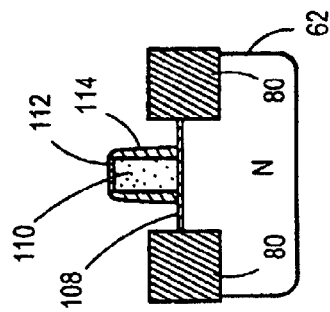
Figure 28B:
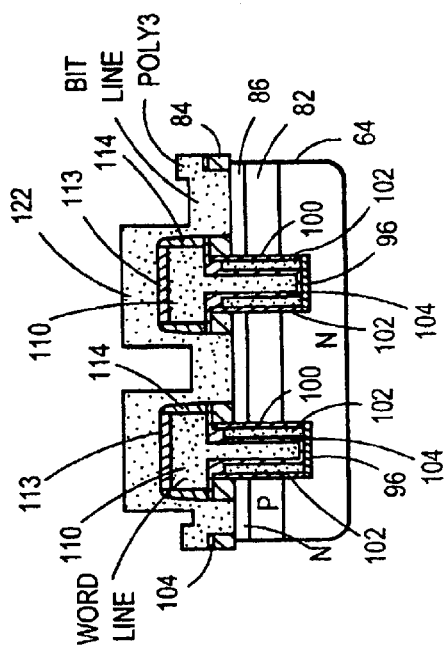
Figure 29B:
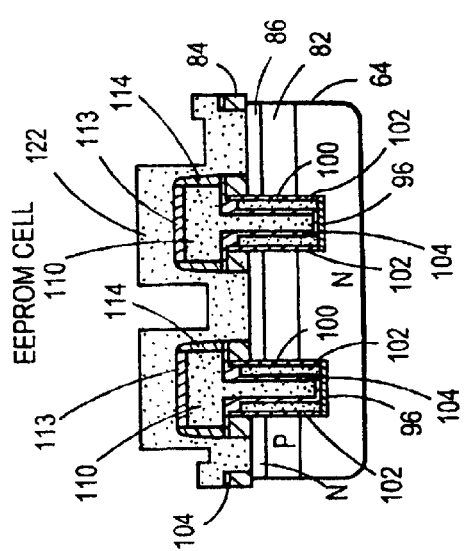

Referring to FIGS. 27A, B and C, to open contact holes 118 and 120 to the EEPROM cell, a layer of photoresist is deposited and developed with a ninth mask to form a cell contact etch mask layer 116 protecting the PMOS and NMOS devices. The developed photoresist of layer 116 is also located so as to bound the outer limits of the contact holes to be etched through the ONO layer 104 and the oxide layer 84. The other boundaries of these contact holes are self aligned with the outer edges of the spacer oxide 114. Oxide layers 113 are then formed on top of the second polysilicon control gates 110 using the photoresist 116 as a mask as shown in FIG. 28B.

The ONO etch and oxide etch is then performed to leave the structure as shown in FIGS. 27A, B and C with contact holes 118 and 120 to the N type layer 86 for the bit line connections (not shown).

To form the bit lines corresponding to the bit line 30 in FIGS. 5 and 6, a layer of metal or polysilicon 122 is deposited over the structure. Metal is shown at 122 in FIG. 28B, but doped polysilicon is preferred for better step coverage.

Figure 28A:
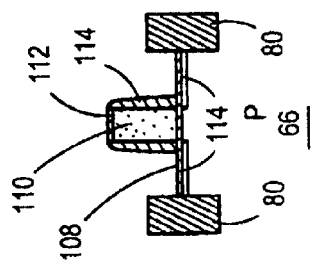

Photoresist is then deposited and a tenth mask is used to develop it to form a protective layer over the EEPROM devices so as to allow removal of the metal or polysilicon off the NMOS and PMOS devices and so as to define the outlines of the bit lines. The metal or polysilicon 122 is then etched into the shape of the bit lines and removed from over the PMOS and NMOS devices to leave the structure as shown in FIGS. 28A, B and C.

Next, to complete the NMOS device, an N+arsenic implant must be performed in the P well. To accomplish this, a layer of photoresist is deposited and developed with an eleventh mask to protect the EEPROM cell and the PMOS active area by photoresist which is not shown in the figures. An N+arsenic implant is then performed using this photoresist exposing the P well and the polysilicon 110 and the spacer oxide 114 as a mask to form the self-aligned source and drain regions 130 and 132.

Figure 29A:
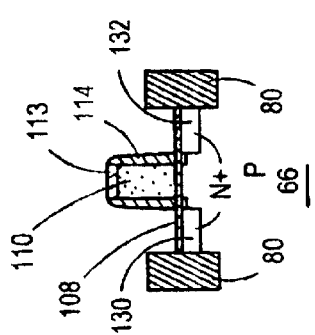

To complete the PMOS device, another layer of photoresist is deposited and developed with mask 12 to expose the N well 62 and protect the EEPROM active area and the P well 66. A P+boron implant is then performed using this photoresist as a mask and the second polysilicon control gate 110 and spacer oxide 114 as a mask to form self-aligned source and drain regions 134 and 136. This leaves the structure as shown in FIGS. 29A, B and C.

To repair the implant damage, the structure is annealed at 1000 centigrade for 30 seconds.

To passivate the structure, a BPSG deposition is performed to a thickness of 6000 angstroms.

To complete the NMOS and PMOS devices, contacts to the source and drains of the PMOS and NMOS devices must be made. To do this, a layer of photoresist is deposited and developed using contact mask 13. An etch is then performed to cut the contact holes 138, 140, 142 and 144 through the BPSG layer 146.

After a contact reflow to soften the edges for better step coverage, a layer of metal is then deposited to 7000 angstroms and etched to form the contacts 148, 150, 152 and 154 to complete the structure as shown in FIGS. 31A, B and C.

Figure 32:
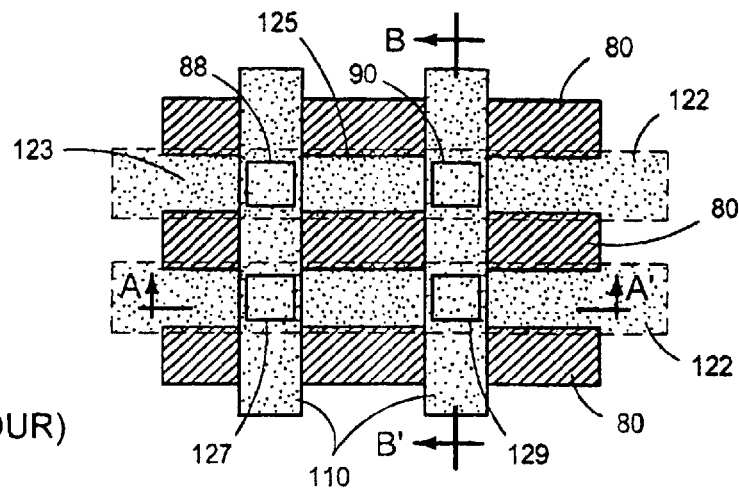
FIG. 32 is a plan view of four cells in an array of EEPROM cells according to the teachings of the invention.

Referring to FIG. 32, there is shown a plan view of four cells in an array of vertically oriented EEPROM cells according to the teachings of the invention and constructed according to a process which is compatible with the simultaneous formation of CMOS devices on the same die. The outlines of two recessed gate windows in which two EEPROM cells are formed are shown at 88 and 90. First polysilicon word lines are shown at 110. The metal or second polysilicon bit lines are shown at 122. The drain regions of the EEPROM cells are shown at 123 and 125.

Figure 33:
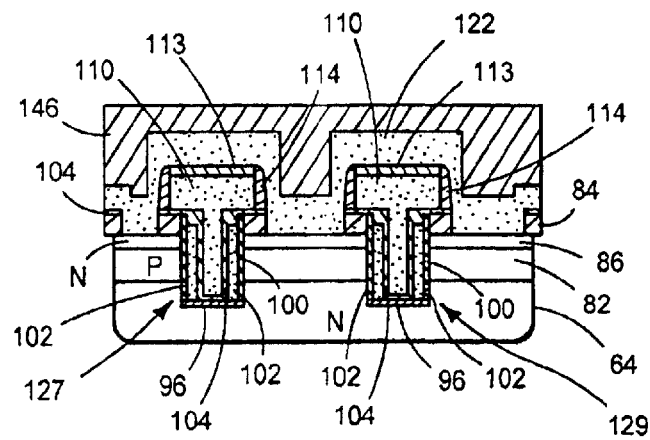
FIG. 33 is a sectional view through a typical EEPROM cell according to the teachings of the invention taken along section line A–A' in FIG. 32.
Figure 34:
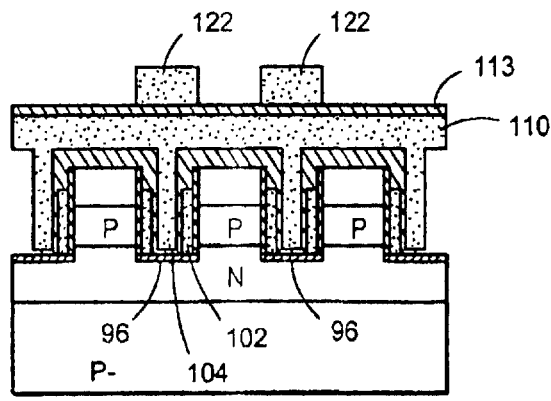
FIG. 34 is a sectional view through a typical EEPROM cell according to the teachings of the invention taken along section line B–B' in FIG. 32.

FIG. 33 is a cross-sectional view taken along section line A–A' in FIG. 32 of the lower two EEPROM cells having recessed gate windows shown at 127 and 129 in FIG. 32. FIG. 34 is a cross-sectional view of the EEPROM cells in recessed gate windows 90 and 129 in FIG. 32 taken along section line B—B therein. Structural elements in FIGS. 33 and 34 corresponding to elements in FIGS. 7A, B and C through 31A, B and C and FIG. 32 have the same reference numerals.

There is given below a table summarizing the above described process of building the flash EEPROM according to the teachings of the invention which is compatible with simultaneous fabrication of CMOS devices on the same die.

PROCESS FLOW FOR CONSTRUCTING A SELF-ALIGNED EEPROM MEMORY CELL COMPATIBLE WITH CMOS DRIVERS ON THE SAME DIE

| STEP | DETAILS | MASK | FIG. |
|---|---|---|---|
| 1. Start with silicon substrate | P-Type, Resistivity __ | | |
| 2. Grow a layer of oxide | Approx. 300 angstroms | | |
| 3. Deposit a layer of nitride | Approx. 1000 angstroms | | |
| 4. Deposit and develop a layer of photoresist using twin well mask | | Mask 1 | |
| 5. Etch nitride layer over portion of substrate to become N-well 62 | | | |
| 6. Form N-well 62 with phosphorous implant | 3000 anstroms deep, conventional dosage | | |
| 7. Drive phosphorous and re-oxidize N-well 62 | 1000 degrees C., 1 hour | | |
| 8. Strip photoresist and nitride | | | |
| 9. Implant Boron to form P-well 66 | | | |
| 10. Drive the N and P wells 62, 64 and 66 deeper | 1100 degrees C., 5 hours, 5–6 microns deep after drive | | FIG. 7A, B and C |
| 11. Etch oxide over N-well 62 to clear the surface thereof for further processing | | | |
| 12. Grow pad oxide | 300 angstroms | | |
| 13. Deposit nitride layer | 1000 angstroms | | |

-continued

PROCESS FLOW FOR CONSTRUCTING A SELF-ALIGNED EEPROM MEMORY CELL COMPATIBLE WITH CMOS DRIVERS ON THE SAME DIE

| STEP | DETAILS | MASK | FIG. |
|---|---|---|---|
| 14. Deposit photoresist and use active mask to develop photoresist to define etch masks 70, 72, 74 for active areas | | Mask 2 | FIG. 8A, B and C |
| 15. Etch oxide/nitride layer 68 to define active areas | | | FIG. 9A, B and C |
| 16. Deposit a layer of photoresist and develop using a field implant mask to form field implant mask 76 | | Mask 3 | FIG. 10A, B and C |
| 17. Boron implant to deposit field implant impurities in P well. | Conventional dosage and energy | | |
| 18. Grow field oxide | 6000 angstroms | | FIG. 11A, B and C |
| 19. Deposit photoresist and develop with mask 4 to leave exposed only the ONO layer 68 over the EEPROM cells | | Mask 4 | |
| 20. Etch away ONO layer 68 over EEPROM cell | | | FIG. 12A, B and C |
| 21. Implant boron to form P region 82 below substrate surface throughout N well in which EEPROM is to be formed to make channel region 12 of finished device as shown in FIG. 5. | 100 KEV, 1E + 12 | | |
| 22. Implant arsenic to redope to N type region 86 below surface but above P layer 82 | 30 KEV, 1E + 14 | | FIG. 13A, B and C |
| 23. Grow layer of oxide 84 over EEPROM cell area | 2000 angstroms | | FIG. 14A, B and C |
| 24. Deposit layer of photoresist and use cell etch mask 5 to develop to open windows for etching recessed gate windows 88 and 90 | | Mask 5 | |
| 25. Anisotropically etch recessed gate windows 88 and 90 through N layer 86 and P layer 82 into N well 64 | | | FIG. 15A, B and C |
| 26. Grow pad oxide layer over whole substrate to protect underlying structures from second nitride layer | 300 angstroms | | |
| 27. Deposit second nitride layer 92 which is thinner than first nitride layer 68 | 500 angstroms | | FIG. 16A, B and C |
| 28. Perform nitride etchback to remove nitride of layer 92 on all horizontal surfaces and leave it covering only the vertical walls of the recessed gate windows 88 and 90 | anisotropic etch | | FIG. 17A, B and C |
| 29. Grow oxide 96 on bottoms of recessed gate windows | 2000 angstroms | | FIG. 18A, B and C |
| 30. Cell nitride strip | dip off nitride in wet etch | | FIG. 19A, B and C |
| 31. Pad oxide strip | dip off pad oxide in wet etch | | |
| 32. Grow thin gate oxide layer 100 | 90–100 angstroms, conventional process | | |
| 33. Deposit doped polysilicon layer 102 from which floating gate is to be formed | 1000 angstroms doped P type to 50 ohms per square | | FIG. 20A, B and C |
| 34. Etch back doped polysilicon layer 102 from horizontal surfaces to leave floating gates | | | FIG. 21A, B and C |
| 35. Form Oxide-Nitride-Oxide layer 104 above floating gates | Conventional process, 150 angstroms | | FIG. 22A, B and C |
| 36. Form ONO protect mask 106 | | Mask 6 | |
| 37. ONO etch, nitride etch to clear PMOS and NMOS active areas for transistor formation | | | FIG. 23A, B and C |
| 38. Threshold voltage adjust implant | Boron | | |
| 39. Leaving photoresist mask 106 in place, etch away pad oxide under first nitride layer 68 to expose N well and P well silicon | | | |
| 40. Leaving photoresist mask 106 in place, grow thin gate oxide 108 over N well 62 and P well 66 | 150 angstroms | | |
| 41. Remove photoresist mask 106, and deposit doped second polysilicon layer 110 over entire structure | 3000 angstroms | | |
| 42. Oxidize second polysilicon | 2000 angstroms | | FIG. 24A, B and C |
| 43. Deposit photoresist, and use 7th mask to develop a second poly etch mask | | Mask 7 | |
| 44. Etch second polysilicon 110 and overlying oxide to form control gates and word lines corresponding to word line 28 in finished device of FIG. 5 | | | |
| 45. Deposit photoresist and develop using 8th mask to protect PMOS and EEPROM devices to form LDD implant mask | | Mask 8 | |
| 46. Phosphorous LDD implant using control gate poly as a mask to form self-aligned LDD regions of NMOS devices. | Conventional process | | FIG. 25A, B and C |
| 47. Deposit spacer oxide | 3000 angstroms | | |
| 48. Anisotropically etch spacer oxide to leave spacers on sidewalls of polysilicon control gates. | | | FIG. 26A, B and C |
| 49. Deposit photoresist and develop with Mask 9 to protect the NMOS and PMOS devices for a bit line contact hole etch and reoxidize tops of second polysilicon 110 to form oxide layer 113 | | Mask 9 | FIG. 27A, B and C |
| 50. Etch self aligned bit line contact holes 118 and 120 through ONO 104 and oxide 84 | | | |
| 51. Deposit bit line metal or poly 122 | 5000 angstroms | | |
| 52. Deposit layer of photoresist and develop using 10th mask to form protective mask layer over NMOS and PMOS devices | | Mask 10 | |
| 53. Etch bit line metal layer 122 to form bit lines | | | |
| 53. Deposit photoresist and develop using mask 11 to expose P well 66 and protect EEPROM active area 64 and N well 62 | | Mask 11 | |
| 54. N+ arsenic source and drain implant for NMOS device | Arsenic, conventional process | Mask 12 | FIG. 29A, B and C |
| 55. Anneal implants | 1000 C., 30 sec | | |

-continued

PROCESS FLOW FOR CONSTRUCTING A SELF-ALIGNED EEPROM MEMORY CELL COMPATIBLE WITH CMOS DRIVERS ON THE SAME DIE

| STEP | DETAILS | MASK | FIG. |
|---|---|---|---|
| 56. BPSG passivation deposition | 6000 angstroms | | |
| 57. Deposit photoresist and develop with contact mask 13 to form mask for contact holes for NMOS and PMOS devices | | Mask 13 | |
| 58. Etch contact holes | | | |
| 59. Contact reflow | | Mask 14 | |
| 60. Metal deposition, mask and etch to form contacts 148, 150, 152 and 154 | 7000 angstroms | Mask 15 | FIG. 31A, B and C |

What is claimed:

1. A nonvolatile EPROM or EEPROM memory cell formed using a vertical MOS transistor comprising:

a semiconductor substrate doped to have a first conductivity type so as to act as a source region of said nonvolatile memory cell, said first conductivity type being either N-type or P-type, and having a top surface which extends horizontally and a depth which extends vertically;

a vertical MOS transistor formed by alternating, abutting N-type and P-type doped layers in said substrate which have junctions therebetween to form a channel region and a drain region of said vertical MOS transistor with said drain region having A, said first conductivity type and said channel region having a second conductivity type which is P-type if said first conductivity type is N-type and is N-type if said first conductivity type is P-type, said substrate forming a source region of said first conductivity type of said vertical MOS transistor, said source regions having a junction with said channel region, and wherein a well with one or more walls is etched vertically down through said top surface of said substrate and through said channel and drain regions and at least partially into said source region such that at least said drain and channel regions surround said well and form at least a portion of said one or more walls of said well, said well having a bottom and having formed therein a self aligned floating gate of conductive material which does not have any horizontal component on said top surface of said substrate through which said well was etched nor on said bottom of said well and which does not extend laterally beyond a perimeter of said well, said perimeter of said well being defined by an intersection of said one or more walls of said well and said surface of said substrate into which said well was etched, and said self aligned floating gate insulated from said channel and drain regions and said substrate by a layer of insulating material, said floating gate being laterally adjacent to at least said portion of said wall of said well formed by said channel region of said vertical MOS transistor such that differing levels of trapped charge in said floating gate affects the conductivity of said channel region and a threshold of said nonvolatile memory cell;

a word line contact which also functions as a control gate of said nonvolatile memory cell comprising a layer of conductive material formed on said substrate so as to extend vertically down into said well and lie laterally adjacent to said floating gate but be X; insulated therefrom by an insulation layer such that voltage applied to said control gate affects the charge on said floating gate;

a spacer insulating layer formed on top and side surfaces of said word line contact, with an edge of said spacer insulating layer defining an inner edge of a contact hole to said drain region, said inner edge being an edge of said contact hole closest to said well; and a self aligned bit line and contact to the drain area of said vertical MOS transistor, said self aligned bit line comprising a layer of conductive material formed on said substrate so as to be in electrical contact with said drain region of said vertical MOS transistor via a self aligned contact hole.

2. A substructure of a vertical MOS transistor forming part of a nonvolatile memory cell comprising:

a semiconductor substrate having a top surface which extends in a horizontal direction and a thickness which extends in a vertical direction and having a drain region of a first conductivity type formed therein and suitable to act as a drain of a vertical MOS transistor;

a buried layer channel region in said semiconductor substrate doped so as to have a second conductivity type having the majority of charge carriers therein of a different polarity than said first conductivity type and suitable to act as a channel of a vertical MOS transistor formed in said substrate;

a source region of said semiconductor substrate below said channel region, said source region being doped so as to have said first conductivity type and suitable to act as a source of a vertical MOS transistor;

a well etched vertically into said top) surface of said semiconductor substrate, said well having one or more side walls and being deep enough to penetrate through said drain region and be surrounded on all sides by said drain region and said channel region and extending at least partially into said source region such that at least some portions of said one or more side walls of said well are defined by intersections with said source, drain and channel regions, said well also having a bottom;

an insulating layer covering the bottom of said well;

a gate insulating layer formed on said one or more side walls of said well;

a self aligned floating gate formed in said well comprising a conductive material formed within said well on said gate insulating layer on each wall of said well but formed so as to not have any horizontal component of conductive material which lies on said top) surface of said substrate through which said well was etched nor any horizontal component on said bottom of said well nor any conductive material which extends beyond a perimeter of said well, said perimeter defined as the intersection of said one or more walls of said well and said top surface of said substrate through which said well was etched, said self aligned floating gate positioned laterally adjacent to said intersection of said one or more side walls and said channel region such that trapped-charge in said floating gate affects the conductivity of channel regions and a threshold of said vertical MOS transistor;

an insulating layer formed over said self aligned floating gate so as to electrically isolate said floating gate from all surrounding structures; and a word line comprising conductive material deposited so as to extend into said well far enough to lie laterally adjacent to said floating gate so as to form a control gate of a vertical MOS transistor nonvolatile EEPROM or EPROM memory cell structure.

3. A nonvolatile memory cell array comprising:
a semiconductor substrate having a top surface which extends horizontally and having a depth which extends vertically;
an array of nonvolatile memory cells arranged into rows and columns, said rows having a longest axis along which said nonvolatile memory cells are spaced and said columns having a longest axis along which said nonvolatile memory cells are spaced, and wherein each nonvolatile memory cell in cash row shares a common drain region with a neighboring memory cell to the left in said row and shares a common drain region with a neighboring memory cell to the right in said row, and wherein each drain region in each row is contacted by a bit line through a self aligned contact window, and wherein each memory cell in a column shares a word line which also acts as a control gate at the location of each memory cell, and wherein each said nonvolatile memory cell in said array is comprised of:
  a nonvolatile EEPROM or EPROM memory cell comprising:
    a vertical MOS transistor formed by a first layer of said semiconductor substrate of N-type conductivity forming a drain region of said vertical MOS transistor, a second layer of said substrate of P-type conductivity and vertically adjacent to and beneath said first layer relative to said top surface of said substrate so as to form a channel region of said vertical MOS transistor, and a third layer of said substrate of N-type conductivity within said substrate and vertically adjacent to and beneath said second layer relative to said top surface of said substrate so as to form a source region of said vertical MOS transistor, said substrate also having a well vertically etched therein so as to penetrate through said top surface and said first and second layers and at least partially through said third layer such that said well is surrounded on all sides by said drain region, said well having at least a portion of the wall or walls thereof formed by the intersection of said well with said drain and channel regions, and said well having a self aligned floating gate of conductive material formed therein as an annulus of conductive material on each vertical wall of said well and formed so as to not extend horizontally beyond the intersection of said walls of said well and said top surface, said floating gate not having any horizontal component of conductive material on said top surface of said substrate or on a bottom surface of said well and including at least a portion thereof which lies laterally adjacent to said portion of said wall of walls of said well formed by the intersection of said well with said channel region such that trapped charge in said floating gate affects the conductivity of said channel regions and a threshold of said vertical MOS transistor, said floating gate being insulated from said walls of said well by a layer of gate insulating material;
    a portion of said word line acting as a control gate of said nonvolatile memory cell, said control gate comprising a layer of conductive material formed so as to extend down into said well and have at least a portion thereof which is laterally adjacent to said floating gate but insulated therefrom by an insulation layer so as to act as said control gate for said vertical MOS transistor;
    a self aligned drain contact formed from a portion of said bit line for a row of said array in which said vertical MOS transistor is formed, said bit line comprising a layer of conductive material formed above said top surface of said substrate and passing over each said nonvolatile memory cell in said row of said array in which said nonvolatile memory cell is formed and filling self aligned drain contact windows on each side of said well in a row of which said vertical MOS transistor is a part so as to be in electrical contact with said shared drain regions of each side of said well in a row of which said vertical MOS transistor is a part; and
    a spacer layer of insulating material insulating said word line from said bit line and wherein portions of said spacer layer insulating outer edges of said word line which forms a control gate of said nonvolatile memory cell define the inner edge of said self aligned drain contact window on each side of said well in a row of which said nonvolatile memory cell is a part, said inner edge of said self aligned contact windows being defined as the edges closest to said well, and wherein said outer edges of said word line are defined as edges of said word line farthest from a center of said well along said longest axis of a row of said array of which said nonvolatile memory cell is a part.

4. The apparatus of claim 3 wherein said bit line is formed above said first layer so as to be above the top surface of said substrate and passes over said word lines at the location of each said nonvolatile memory cell and wherein said self aligned contact windows extend from said outer edge of each word line to the closest outer edge of an adjacent word line, where an adjacent word line is defined as a word line in an immediately adjacent column of said array, the structure of said self aligned drain contact windows thereby being such that each said bit line of a row of said array contacts each said first layer shared drain region at all points that form a top surface of said first layer between said spacer layers of insulating material that insulate said outer edges of said adjacent word lines.

5. The apparatus of claim 3 wherein said memory cell is part of an array comprised of rows and columns of adjacent memory cells and wherein said bit line contacts said first layer at at least some points between said spacer layers of the word lines of adjacent memory cells and runs over the top of word lines said bit line has to cross and is insulated from each said word line at the location of each said memory cell by said spacer layer.

6. A vertically integrated nonvolatile memory MOS transistor formed along a long axis of a row of nonvolatile memory transistors in a memory array, comprising:
  a substrate having a top surface that extends horizontally and a depth which extends vertically and which is doped to a have a first conductivity type and having an active area therein doped to a second conductivity type and a conductivity level suitable to act as a source region of a vertically integrated MOS nonvolatile memory transistor;
  a buried channel region in said active area doped to have said first conductivity type and a conductivity suitable to act as a channel region of said vertically integrated MOS nonvolatile memory transistor;
  a drain region in said active area doped to have said second conductivity type and a conductivity suitable to act as a drain region of said vertically integrated MOS nonvolatile memory transistor;

a well etched vertically down through said top surface of said substrate and through said drain and channel regions and at least partially into said source region so as to be surrounded on all sides by said drain and channel regions and so as to be on a long axis of a row of said nonvolatile memory transistors in a memory array;

a gate insulation layer formed on the walls of said well and an insulating layer on a floor of said well;

a self aligned conductive floating gate formed on all walls of said well so as to form an annulus and formed so as to never have any horizontal component on a bottom surface of said well and never have any horizontal component which extends onto said top surface of said substrate and outside the intersection of said walls of said well and said top surface of said substrate, said self aligned floating gate also being and formed on said gate insulation layer such that all portions of the walls of said well that intersect said channel region are horizontally adjacent said floating gate such that trapped charge on said floating gate can alter the conductivity of said channel region and the threshold of said vertically integrated MOS nonvolatile memory transistor, an integrate insulation layer formed on said floating gate suitable to insulate said floating gate from all surrounding conductive structures;

a conductive control gate formed in said well so as to be horizontally adjacent to said floating gate such that a first potential applied to said control gate causes charges to tunnel into said floating gate and a second potential applied to said control gate causes charges to tunnel out of said floating gate, said control gate extending up to and making contact with or being part of a conductive word line formed across said top surface of said substrate;

a control gate insulating layer which insulates the top of said word line and one or more spacer insulation layers which insulate the sides of said word line the outer edges of said spacer insulation layer defining the inner edges of a self aligned contact hole to said drain region on each side of said well along said long axis of said row of said nonvolatile memory transistor in an array, said outer edges being defined as the edges farthest from the center line of said well in a direction along said long axis of said row;

two self aligned contact windows which are etched so as to be self aligned to said outer edges of said spacer insulation layers and which open said drain region to electrical contact on each side of said well along said long axis of said row; and a conductive bit line formed across said top surface of said substrate along said long axis of said row so as to make contact with said drain region through each of said two self aligned contact windows.

7. The apparatus of claim 1 wherein said nonvolatile memory cell is formed with a process which simultaneously forms PMOS and NMOS devices on the same substrate as said nonvolatile memory cell but forms said PMOS and NMOS devices in different active areas from an active area in which said nonvolatile memory cell is formed, and wherein said source, channel and drain regions of said nonvolatile memory cell are formed with said process which simultaneously forms said PMOS and NMOS devices and are formed while said active areas of said PMOS and NMOS devices are covered by an insulation layer.

8. In a vertically integrated nonvolatile memory cell structure formed using a vertical well that penetrates down through a top surface of a substrate and into doped drain and channel regions and into a source region of a said substrate such that said doped drain and channel regions are adjacent to at least two sides of said well, said two sides being sides orthogonal to a long axis of a row of nonvolatile memory cells in an array of nonvolatile memory cells of which said vertically integrated nonvolatile memory cell structure is a part, said vertical well having a top edge defined by the intersection of vertical walls of said well with said top surface of said substrate and having a horizontal bottom surface, a self aligned floating gate substructure comprising:

a self aligned floating gate insulating material layer on said vertical walls of said well which does not ever extend above said top edge of said well;

an insulating layer on said bottom of said well;

a self aligned floating gate conductor material formed on said self aligned floating gate insulating material so as to form an annulus that covers all vertical walls of said well as so as to not ever any horizontal component on said bottom of said well and not ever have any horizontal component which extends above said top edge of said vertical well onto said top surface of said substrate.

9. The apparatus of claim 8 further comprising a self aligned layer of silicon dioxide/nitride/silicon dioxide (hereafter ONO) covering said self aligned said gate conductor material, and a doped polysilicon conductor control gate covering said ONO layer, said control gate extending above said top edge of said well, and a layer of silicon dioxide insulator covering a top surface of said control gate and self aligned spacer layers of silicon dioxide insulating side edges of said control gate, said ONO layer being self aligned so as to not extend horizontally beyond said side edges of said control gate.

10. The apparatus of claim 8 wherein said self aligned floating gate substructure is formed by the following process:

forming a vertical well by etching vertically through a layer of silicon dioxide (herafter oxide) covering a top surface of said substrate of semiconductor material, and etching vertically down into said substrate through said doped drain and channel regions and into said source region;

depositing a layer of nitride insulator on the bottom of said well and on pad oxide formed on vertical side walls of said well and on horizontal surfaces of an insulating layer over said drain region;

anisotropically etching said nitride back from all horizontal surfaces to leave nitride only on said vertical walls of said well;

growing a layer of oxide on said bottom of said well;

wet etching said nitride off said vertical walls of said well to expose said pad oxide;

growing said self aligned floating gate insulating material layer only on said vertical walls of said well since the bottom of said well is already covered by an oxide layer and a top surface of said substrate is also already covered by an oxide layer;

depositing a layer of doped polysilicon over said substrate and into said well to cover said vertical walls and bottom of said well;

forming a self aligned floating gate without using a mask by etching back said doped polysilicon from all horizontal surfaces thereby removing all doped polysilicon from a top surface of said oxide layer which covers said top surface of said substrate and said bottom of said vertical well and leaving doped polysilicon on all vertical walls of said well.

11. The apparatus of claim 9 wherein said self aligned floating gate substructure, said self aligned control gate and said self aligned ONO layer are formed by the following process:

1) forming a vertical well by etching vertically through a layer of silicon dioxide (hereafter oxide) covering a top surface of said substrate of semiconductor material, and etching vertically down into said substrate through said doped drain and channel regions and into said source region;

2) depositing a layer of nitride insulator on the bottom of said well and on pad oxide formed on vertical side walls of said well and on horizontal surfaces of an insulating layer over said drain region;

3) anisotropically etching said nitride back from all horizontal surfaces to leave nitride only on said vertical walls of said well;

4) growing a layer of oxide on said bottom of said well;

5) wet etching said nitride off said vertical walls of said well to expose said pad oxide;

6) growing said self aligned floating gate insulating material layer only on said vertical walls of said well since the bottom of said well is already covered by an oxide layer and a top surface of said substrate is also already covered by an oxide layer;

7) depositing a layer of doped polysilicon conductor over said substrate and into said well to cover said vertical walls and bottom of said well;

8) forming a self aligned floating gate by etching back said doped polysilicon from all horizontal surfaces thereby removing all doped polysilicon from a top surface of said oxide layer which covers said top surface of said substrate and from said bottom of said vertical well and leaving doped polysilicon on all vertical walls of said well, 9) forming a layer of silicon dioxide insulator covered by a layer of nitride insulator covered by another layer of silicon dioxide insulator (hereafter ONO) over said oxide layer covering said top surface of said substrate, said ONO layer extending down into said vertical well and covering said self aligned floating gate;

10) depositing over said ONO layer a second layer of doped polysilicon conductor from which said self aligned control gate will be formed;

11) growing a layer of oxide over said second layer of doped polysilicon;

12) etching away portions of said second layer of doped polysilicon to define lateral extents of said self aligned control gate above said top surface of said substrate leaving said layer of oxide on a top surface of said control gate;

13) depositing a layer of oxide over said surface of said substrate and covering said control gate's vertical side walls;

14) anisotropically etching back said layer of oxide deposited in step 13 to remove oxide only from horizontal surfaces and leaving spacer oxide only on vertical side walls of said polysilicon of said control gate and word line thereby defining outer edges of said spacer oxide layer where said outer edges are edges of said spacer oxide layer which are farthest from a centerline of said well in a direction along said long axis of said row;

15) photolithographically etching to define the lateral extents of contact holes to said drain region etching through said ONO layer formed in step 9 and said oxide layer covering said top surface of said substrate to self align said ONO layer to the lateral extents of said control gate and leave two contact holes to said drain regions adjacent to said two side of said well which are orthogonal to said long axis of said row of nonvolatile memory cells in said array of nonvolatile memory cells, said contact holes being self aligned to said outer edges of said spacer oxide layer.

* * * * *